United States Patent
Akamatsu et al.

(10) Patent No.: US 8,221,594 B2
(45) Date of Patent: Jul. 17, 2012

(54) MAGNETRON SPUTTERING APPARATUS AND MAGNETRON SPUTTERING METHOD

(75) Inventors: Yasuhiko Akamatsu, Sammu (JP); Kyuzo Nakamura, Chigasaki (JP); Motoshi Kobayashi, Sammu (JP); Junya Kiyota, Sammu (JP); Tomiyuki Yukawa, Sammu (JP); Masaki Takei, Sammu (JP); Yuuichi Oishi, Sammu (JP); Makoto Arai, Sammu (JP); Satoru Ishibashi, Sammu (JP)

(73) Assignee: Ulvac, Inc., Chigasaki-shi (JP)

( * ) Notice: Subject to any disclaimer, the term of this patent is extended or adjusted under 35 U.S.C. 154(b) by 0 days.

(21) Appl. No.: 12/883,490

(22) Filed: Sep. 16, 2010

(65) Prior Publication Data

US 2011/0048926 A1    Mar. 3, 2011

Related U.S. Application Data

(63) Continuation of application No. PCT/JP2009/054536, filed on Mar. 10, 2009.

(30) Foreign Application Priority Data

Mar. 17, 2008 (JP) ................................. 2008-068534

(51) Int. Cl.
  *C23C 14/35* (2006.01)
(52) U.S. Cl. ......... 204/192.12; 204/298.06; 204/298.11; 204/298.14; 204/298.19
(58) Field of Classification Search ............. 204/298.06, 204/298.11, 298.14, 298.19, 298.2, 192.12
See application file for complete search history.

(56) References Cited

U.S. PATENT DOCUMENTS

| | | | | |
|---|---|---|---|---|
| 4,486,289 A | * | 12/1984 | Parsons et al. | ........... 204/298.09 |
| 4,946,576 A | * | 8/1990 | Dietrich et al. | .......... 204/298.06 |
| 5,728,276 A | * | 3/1998 | Katsuki et al. | ........... 204/298.11 |
| 6,440,280 B1 | * | 8/2002 | Burton et al. | ............ 204/298.06 |

FOREIGN PATENT DOCUMENTS

| | | |
|---|---|---|
| JP | 7-331433 | 12/1995 |
| JP | 11-200037 | 7/1999 |
| JP | 11-302843 | 11/1999 |
| JP | 2001-131743 A1 | 5/2001 |
| JP | 2003-96561 A1 | 4/2003 |
| JP | 2005-514777 A1 | 5/2005 |

OTHER PUBLICATIONS

International Search Report for International Application No. PCT/JP2009/054536 dated Jun. 8, 2009.

* cited by examiner

*Primary Examiner* — Rodney McDonald

(74) *Attorney, Agent, or Firm* — Kratz, Quintos & Hanson, LLP

(57) ABSTRACT

The present invention is to provide a magnetron sputtering technique for forming a film having an even film thickness distribution for a long period of time. A magnetron sputtering apparatus of the present invention includes a vacuum chamber, a cathode part provided in the vacuum chamber, the cathode part holding a target on the front side thereof and having a backing plate to hold a plurality of magnets on the backside thereof, and a direct-current power source that supplies direct-current power to the cathode part. A plurality of control electrodes, which independently controls potentials, is provided in a discharge space on the side of the target with respect to the backing plate.

5 Claims, 4 Drawing Sheets

MAGNETRON SPUTTERING APPARATUS AND MAGNETRON SPUTTERING METHOD

This application is a continuation of International Application No. PCT/JP2009/054536 filed Mar. 10, 2009, which claims priority to Japanese Patent Document No. 2008-068534, filed on Mar. 17, 2008. The entire disclosures of the prior applications are herein incorporated by reference in their entireties.

BACKGROUND OF INVENTION

The present invention generally relates to a technique to form a film by sputtering in a vacuum, and, more particularly, to a film formation technique by magnetron sputtering.

BACKGROUND ART

Conventionally, in a magnetron sputtering apparatus 101 of this kind, a plurality of rod-shaped magnets 112 is arranged on the backside (on the side of a backing plate 108) of a target 107 facing a substrate 104 in a vacuum chamber 102, for example, as shown in FIG. 6(a).

In such a conventional art, when the target 107 is used for a long period of time, the surface of the target 107 is dug; and therefore, differences in impedance are generated among a plurality of magnets 112; and as a result, a problem arises whereby the distribution of plasma in a discharge space becomes uneven.

For example, in the example shown in FIG. 6(a), a lateral region of the target is dug compared to a target region 107a corresponding to the magnet 112 in the center as shown in FIGS. 6(b) and 6(c); and as a result, a problem arises whereby the film thickness on the substrate 104 becomes thinner in the center region than in the edge part region of the substrate 104.

Conventionally, such a problem is addressed by changing the distance between the target 107 and the magnet 112 and correcting the magnetic circuit. However sufficient film-thickness uniformity cannot be obtained. See Japanese Unexamined Patent Publication No. 11-200037 and Japanese Unexamined Patent Publication No. 11-302843.

SUMMARY OF THE INVENTION

The present invention has been developed in order to solve the problems of the conventional art as described above; and an object thereof is to provide a magnetron sputtering technique capable of forming a film having an even film thickness distribution for a long period of time.

The present invention developed in order to achieve the above-described object is directed to a magnetron sputtering apparatus comprising a vacuum chamber; a cathode part provided in the vacuum chamber, the cathode part holding a target on the front side of the cathode part and having a holding mechanism that holds a plurality of magnets on the backside thereof; and a power source that supplies power to the cathode part, wherein a plurality of control electrodes capable of independently controlling potentials is provided in a discharge space on the side of the target with respect to the holding mechanism.

In the present invention, the control electrode is provided corresponding to each of a plurality of magnets in the above-described invention.

In the present invention, the magnet is formed into a rod-shape and the control electrode is arranged so as to sandwich the holding mechanism and overlap the end part of the magnet in the above-described invention.

In the present invention, the control electrode is arranged so as to project inward with respect to the end edge part of the target in the invention.

On the other hand, the present invention is directed to a magnetron sputtering method for generating a magnetron discharge in a vacuum and performing sputtering, comprising the steps of arranging a plurality of control electrodes in a discharge space of a target and making potentials of a plurality of control electrodes different from one another when supplying power to the target in a vacuum and generating plasma.

In the present invention, the potential of the control electrode in a specific region of the target among a plurality of control electrodes is made higher than the potential of the control electrodes in regions other than the specific region of the target when supplying power to the target in a vacuum and generating plasma in the above-described invention.

In the present invention, the specific region of the target is the center region of the target in the above-described invention.

In the present invention, the potential of the control electrode in the specific region of the target is set at a floating potential; on the other hand, the potential of the control electrodes in regions other than the specific region of the target are set at a ground potential in the above-described invention.

According to the present invention, a plurality of control electrodes is arranged in a discharge space of a target. When supplying power to the target in a vacuum and generating plasma, the potentials of a plurality of control electrodes are made different from one another, whereby the impedance of each magnet can be adjusted. Consequently, it is possible to achieve the evenness of film thickness by correcting the unevenness of the distribution of plasma in a discharge space.

In the present invention, if the (absolute value of the) potential of the control electrode in a specific region (for example, the center region) of a target among a plurality of control electrodes is set higher than the (absolute value of the) potential of the control electrodes in regions (for example, lateral regions) other than the specific region of the target, it is possible to relatively increase the plasma density in the discharge space in the specific region. As a result, according to the present invention, it is possible to achieve the evenness of film thickness in a case whereby the center region on the target surface is dug in a long-term use of the target, for example.

In this case, if the potential of the control electrode in the specific region of the target among a plurality of control electrodes is set at a floating potential and on the other hand, if the potential of the control electrodes in regions other than the specific region of the target is set at a ground potential, it is possible to easily aim at the evenness of film thickness by increasing the film formation rate higher in the specific region of the target.

According to the apparatus of the present invention, the above-described invention can be embodied easily with a simplified structural arrangement.

In particular, for example, when the control electrode is provided corresponding to each of a plurality of magnets, or when the magnet is formed into a rod-shape and the control electrode is arranged so as to sandwich the holding mechanism and overlap the end part of the magnet, and when the control electrode is arranged so as to project inward with respect to the end edge part of the target, it is possible to set the potential of the control electrode in the specific region of the target higher than the potential of the control electrodes in regions other than the specific region of the target.

EFFECTS OF THE INVENTION

According to the present invention, it is possible to provide a magnetron sputtering technique capable of forming a film having an even film thickness distribution for a long period of time.

DETAILED DESCRIPTION OF THE INVENTION

A preferred embodiment of the present invention will be described below in detail with reference to the drawings.

Figure 1:
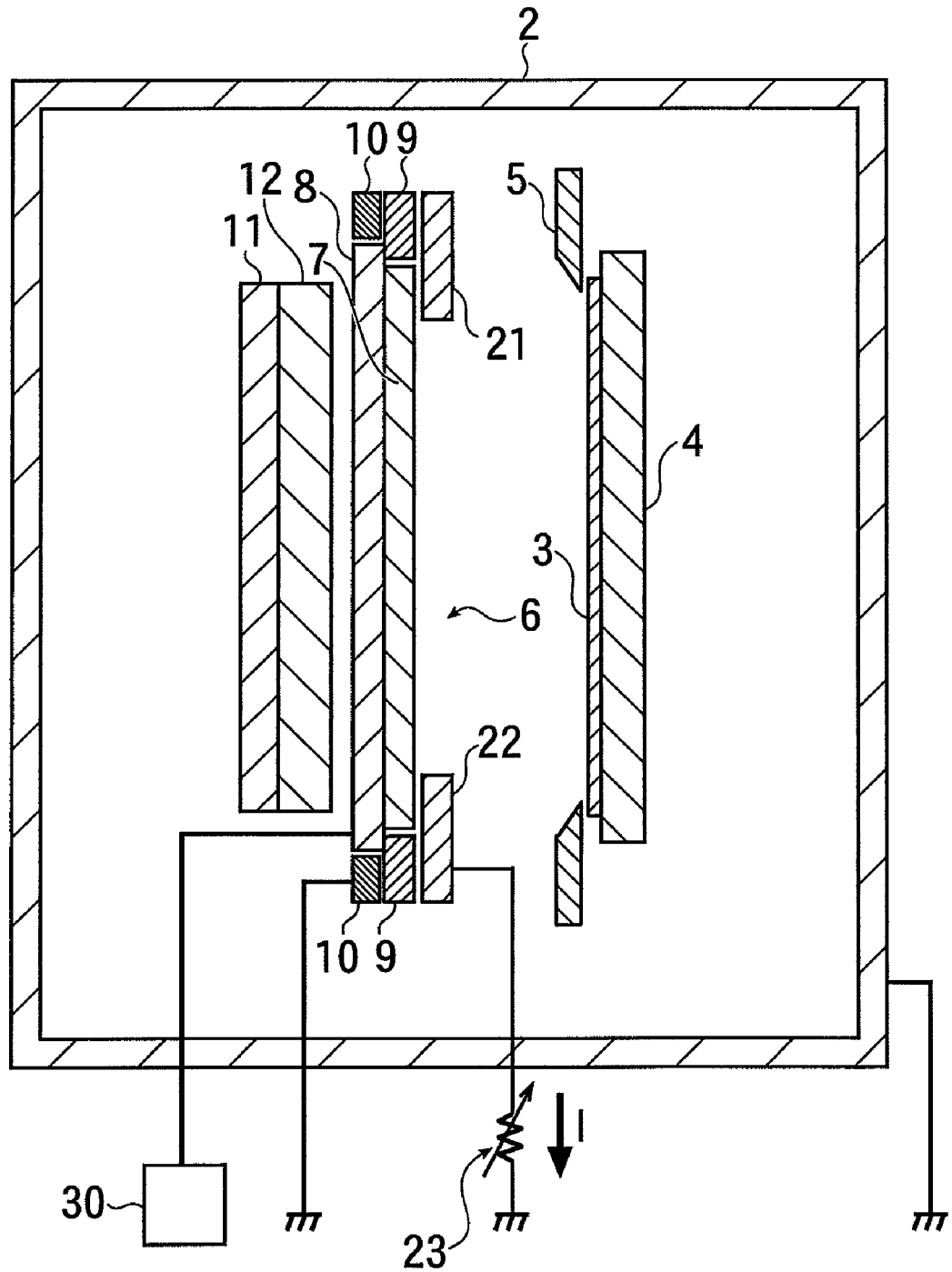
FIG. 1 is a sectional view illustrating an internal structural arrangement of an embodiment of a magnetron sputtering apparatus according to the present invention.
Figure 2:
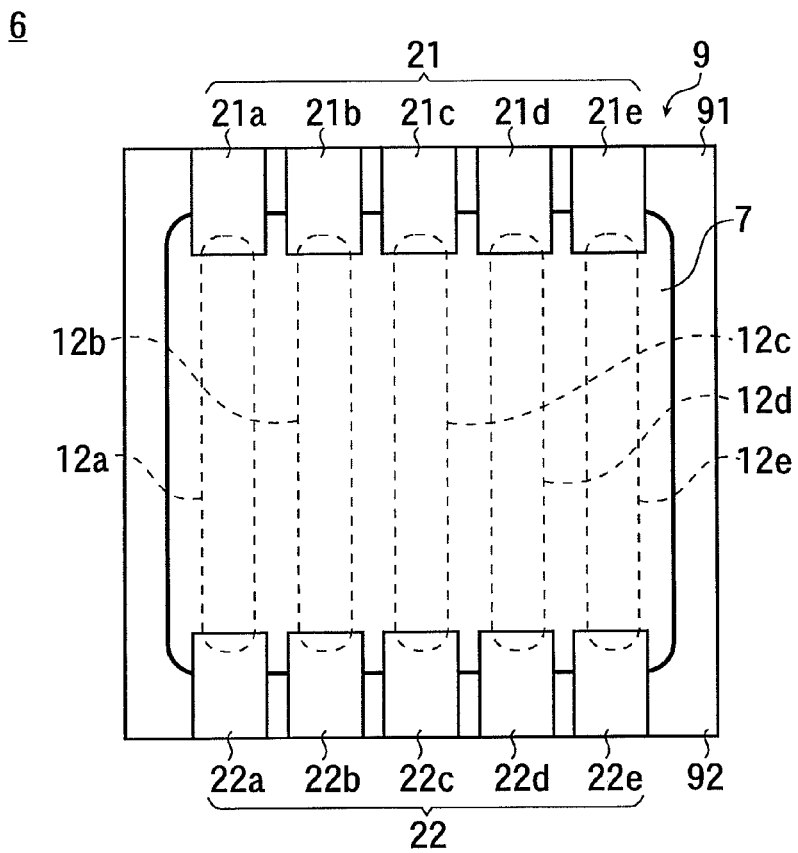
FIG. 2 is a plan view illustrating an external constitution of a cathode part of the magnetron sputtering apparatus.

FIG. 1 is a sectional view illustrating an internal structural arrangement of an embodiment of a magnetron sputtering apparatus according to the present invention; and FIG. 2 is a plan view illustrating an external structural arrangement of a cathode part of the magnetron sputtering apparatus.

As shown in FIG. 1, a sputtering apparatus 1 of the present embodiment has a vacuum chamber 2 connected to a vacuum evacuating system (not shown schematically). The vacuum chamber 2 is at ground potential.

Inside the vacuum chamber 2, a flat plate-shaped substrate (object to be film-formed) 3 is held by a substrate holder 4 in such a manner that the substrate 3 faces a cathode part 6 via a mask 5.

The cathode part 6 has a backing plate (holding mechanism) 8 for holding a target 7, whereby the target 7 faces the substrate in parallel. The backing plate 8 is connected to a direct-current power source 30.

In the region around the target 7, for example, an inner shield member 9 made of a ring-shaped metal is arranged.

In the region around the backing plate 8, for example, an outer shield member 10 made of a ring-shaped metal is provided.

The inner shield member 9 is in a floating potential state. On the other hand, the outer shield member 10 is insulated from the inner shield member 9 and is at ground potential.

As shown in FIG. 2, on the backside of the backing plate 8, a plurality of magnets 12 (five in the present embodiment) made of permanent magnets held by a holding part 11 is provided.

In the present embodiment, a rod-shaped magnet is used for each of magnets 12a to 12e; and magnets are arranged in parallel with one another at a predetermined interval. The size and position of each of the magnets 12a to 12e are determined so as not to bulge out from the region of the target 7.

Further, in the present embodiment, at a pair of edge parts 91, 92, which face the inner shield member 9, control electrodes 21, 22 are arranged, respectively.

The control electrodes 21, 22, for example, made of a rectangular plate-shaped member, are configured by, for example, a metal material (such as, stainless). The control electrodes 21, 22 and the inner shield member 9 are electrically insulated from each other.

The size and the position of the respective control electrodes 21, 22 are determined so as to stick out from the respective edge portions 91, 92 of the inner shield member 9 toward the side of the target 7, which is located inside the edge portions 91, 92.

In the present embodiment, the control electrodes 21, 22 are configured by five control electrodes 21a to 21e and five control electrodes 22a to 22e, respectively, so as to correspond to each of the magnets 12a to 12e.

The control electrodes 21a to 21e and the control electrodes 22a to 22e are respectively formed so as to be somewhat wider than the magnets 12a to 12e, and arranged in a manner such that the respective tip end parts on the side of the target 7 overlap the respective end parts of the magnets 12a to 12e while sandwiching the backing plate 8 and the target 7.

Further, the control electrodes 21a to 21e and the control electrodes 22a to 22e are respectively connected electrically in such a manner that an opposed pair of the control electrodes 21a and 22a, an opposed pair of the control electrodes 21b and 22b, an opposed pair of the control electrodes 21c and 22c, an opposed pair of the control electrodes 21d and 22d, and an opposed pair of the control electrodes 21e and 22e are at the same potential, respectively, the respective opposed pairs of the control electrodes 21a to 21e and 22a to 22e sandwiching each of the magnets 12a to 12e.

Further, the control electrodes 21a to 21e and the control electrodes 22a to 22e are connected to ground outside the vacuum chamber 2 via a variable resistor 23, respectively.

In the present embodiment as discussed above, a plurality of the control electrodes 21, 22 is arranged in a discharge space of the target 7; and when supplying direct-current power to the target 7 in a vacuum and generating plasma, for example, the potential of the control electrodes 21c, 22c in the center region of the target 7 among a plurality of the control electrodes 21, 22 is set at, for example, a floating potential, whereby, the potential is set higher than the potential of the control electrodes 21a, 21b, 21d and 21e and the control electrodes 22a, 22b, 22d and 22e in the lateral region of the target 7.

As a result, it is, for example, possible to relatively increase the plasma density in the discharge space in the center region of the target 7, whereby it is possible to achieve the evenness of the film thickness even when, for example, the center region of the surface of the target 7 is dug in the long-term use of the target 7.

According to the magnetron sputtering apparatus 1 in the present embodiment, it is possible to easily embody the above-discussed invention with a simple structural arrangement.

The present invention is not limited to the above-discussed embodiment but can be modified in a variety of ways.

For example, in the above-discussed embodiment, the potential of the control electrodes 21c, 22c, for example, in the center region of the target 7 among a plurality of the control electrodes 21, 22 is set higher than the potential of the other control electrodes 21a, 21b, 21d and 21e and the other control electrodes 22a, 22b, 22d and 22e. However, the present invention is not limited to the above and it is also possible to independently adjust the potential of any of the other control electrodes 21a, 21b, 21d and 21e and the other control electrodes 22a, 22b, 22d and 22e.

In the above-discussed embodiment, the five control electrodes 21a to 21e and the five control electrodes 22a to 22e are provided, respectively, so as to correspond to each of the magnets 12a to 12e. However, the present invention is not limited to the above, and it is also possible to provide a control electrode so as to correspond only to a specific magnet.

Further, the shape and the position of the control electrode are not limited to those in the above-discussed embodiment; and they can be changed appropriately as long as they remain within the scope of the present invention.

EXAMPLE

An example of the present invention will be described below in detail along with a comparative example.

Sputtering was performed under the condition such that the target-to-magnet distance is 45 mm and the target-to-substrate distance is 125 mm by using the magnetron sputtering apparatus shown in FIG. 1 and FIG. 2 and using aluminum (Al) as a target.

In this case, the input power is 42.8 kW and the pressure is kept at 0.35 Pa by feeding argon (Ar) into the vacuum chamber at 100 sccm.

Further, as a control electrode, a flat plate-shaped electrode made of stainless (140 mm wide) is used; and the control electrode is set in such a manner that it projects 20 mm from each of the end edge parts of the target toward the inside of the target and that the gap between the target and the control electrode is 5 mm.

Sputtering is then performed for 56 seconds, while oscillating each magnet by 100 mm; and thus, a film is formed on the substrate. The result is shown in Table 1 to Table 3.

Table 1 shows film thicknesses when all of the control electrodes are set at the ground potential (condition 1); Table 2 shows film thicknesses when only the control electrodes (21c, 22c) in the center are set at the floating potential (condition 2); and Table 3 shows the result of calculation of differences between film thicknesses under condition 2 and those under condition 1.

Figures in Tables 1 to 3 denote film thicknesses at the measurement positions on the substrate corresponding to the center part of each magnet (the distance from the end part of the substrate is attached for reference) in units of Å.

Figures in the row and column outside Table 1 and Table 2 denote averages of film thicknesses in the rows and columns in each of the Tables.

TABLE 1

All control electrodes are at ground potential (condition 1: Å)

|  | 10 mm | 137.5 mm | 275 mm | 412.5 mm | 540 mm |  |
| --- | --- | --- | --- | --- | --- | --- |
| 10 mm | 3118 | 3631 | 3515 | 3796 | 3281 | 3468 |
| 162.5 mm | 3315 | 4032 | 3700 | 3990 | 3373 | 3682 |
| 325 mm | 3390 | 3780 | 3520 | 3570 | 3290 | 3510 |
| 487.5 mm | 3555 | 4065 | 3635 | 3795 | 3286 | 3667 |
| 640 mm | 3242 | 3829 | 3492 | 3667 | 3126 | 3471 |
|  | 3324 | 3867.4 | 3572.4 | 3763.6 | 3271.2 |  |

TABLE 2

Control electrodes in the center are at floating potential (condition 2: Å)

|  | 10 mm | 137.5 mm | 275 mm | 412.5 mm | 540 mm |  |
| --- | --- | --- | --- | --- | --- | --- |
| 10 mm | 2950 | 3725 | 4025 | 3930 | 2980 | 3522 |
| 162.5 mm | 3120 | 4080 | 4400 | 4305 | 3230 | 3827 |
| 325 mm | 3305 | 4150 | 4235 | 3940 | 3100 | 3746 |
| 487.5 mm | 3440 | 4285 | 4330 | 3920 | 3170 | 3829 |
| 640 mm | 3170 | 3850 | 3970 | 3580 | 3000 | 3514 |
|  | 3197 | 4018 | 4192 | 3935 | 3096 |  |

TABLE 3

Differences between condition 2 and condition 1 (Å)

|  | 10 mm | 137.5 mm | 275 mm | 412.5 mm | 540 mm |
| --- | --- | --- | --- | --- | --- |
| 10 mm | −168 | 94 | 510 | 134 | −301 |
| 162.5 mm | −195 | 48 | 700 | 315 | −143 |
| 325 mm | −85 | 370 | 715 | 370 | −190 |
| 487.5 mm | −115 | 220 | 695 | 125 | −116 |
| 640 mm | −72 | 21 | 478 | −87 | −126 |

As will be understood from Table 1 to Table 3, when the control electrodes (21c, 22c) in the center are set at the floating potential, the film thicknesses in the center and the regions on both sides of the control electrodes (21c, 22c) in the center are large (700 Å at maximum), as compared to the case where all of the control electrodes are set at the ground potential.

It is thought that the plasma density increases and the film formation rate increases in the vicinity of the control electrodes (21c, 22c), which are set at the floating potential.

Table 4 shows film thicknesses when a resistor of 100Ω is connected only to the control electrodes (21c, 22c) in the center (condition 3); and Table 5 shows the result of the calculation in the differences between film thicknesses under condition 3 and film thicknesses under condition 1 (when all of the control electrodes are set at the ground potential).

Under condition 3, a current that flows through the control electrodes (21c, 22c) in the center was −0.7.

TABLE 4

Resistor of 100 Ω is connected to control electrodes in the center (condition 3: Å)

|  | 10 mm | 137.5 mm | 275 mm | 412.5 mm | 540 mm |  |
| --- | --- | --- | --- | --- | --- | --- |
| 10 mm | 2928 | 3509 | 3598 | 3790 | 3260 | 3417 |
| 162.5 mm | 3311 | 3847 | 4003 | 4313 | 3483 | 3791 |
| 325 mm | 3331 | 3884 | 3883 | 3953 | 3397 | 3690 |
| 487.5 mm | 3447 | 4096 | 3950 | 3910 | 3332 | 3747 |
| 640 mm | 3239 | 3757 | 3657 | 3702 | 3174 | 3506 |
|  | 3251.2 | 3818.6 | 3818.2 | 3933.6 | 3329.2 |  |

TABLE 5

Differences between condition 3 and condition 1 (Å)

|  | 10 mm | 137.5 mm | 275 mm | 412.5 mm | 540 mm |
| --- | --- | --- | --- | --- | --- |
| 10 mm | −190 | −122 | 83 | −6 | −21 |
| 162.5 mm | −4 | −185 | 303 | 323 | 110 |
| 325 mm | −59 | 104 | 363 | 383 | 107 |
| 487.5 mm | −108 | 31 | 315 | 115 | 46 |
| 640 mm | −3 | −72 | 165 | 35 | 48 |

As will be understood from Table 1, Table 4, and Table 5, when the resistor of 100Ω is connected to the control electrodes in the center, the film thicknesses in the center and the regions on both sides of the control electrodes in the center become large (300 Å at maximum), as compared to the case where all of the control electrodes are set at the ground potential.

It is thought that the plasma density increases and the film formation rate increases in the vicinity of the control electrodes to which the resistor of 100Ω is connected.

Figure 3:
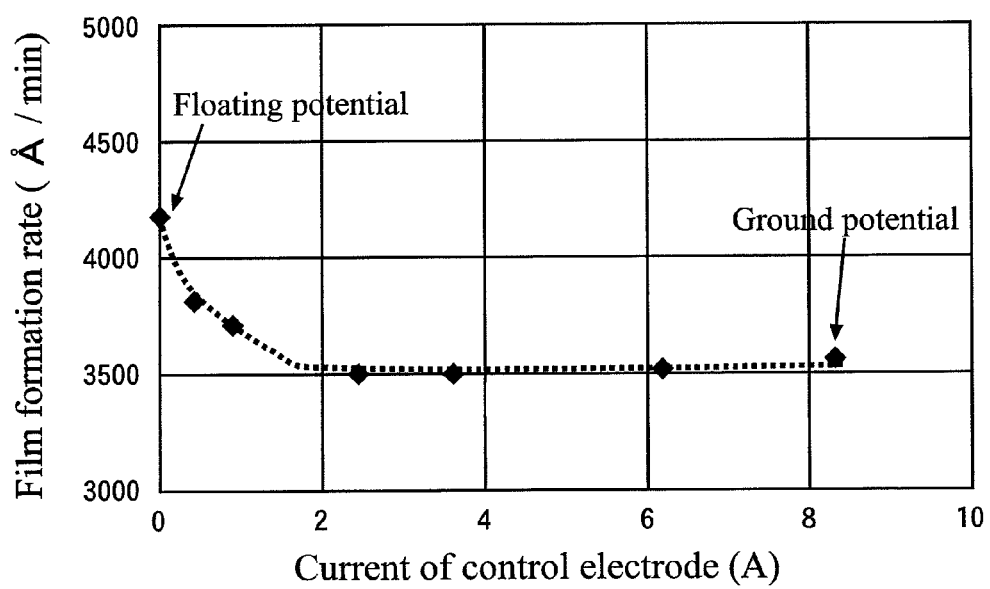
FIG. 3 is a graph for showing a relationship between the magnitude of a current, which flows to a control electrode, and the film formation rate.

FIG. 3 is a graph for showing a relationship between the magnitude of a current that flows through the control electrode and the film formation rate in the above-discussed example.

As will be understood from FIG. 3, when the magnitude of the current that flows through the control electrode is zero (that is, when the control electrodes in the center are at the floating potential), the film formation rate reaches a maximum; and there is a tendency that as the magnitude of the current that flows through the control electrode increases, the film formation rate decreases.

In this case, the film formation rate changes when the current that flows through the control electrode is 0 A to 2 A. Even when the current that flows through the control electrode exceeds 2 A, the film formation rate does not change (decrease).

The inventors of the present invention have confirmed through experiments that when the magnitude of the current, which flows through the control electrode, is varied, the film formation rate does not change in the longitudinal direction of the magnet, as will also be understood from Table 1 and Table 2.

Further, the inventors of the present invention have confirmed by experiments that the film formation rate does not change either when the potential of the inner shield member is set at the ground potential or when it is set at the floating potential and the film formation rate can be adjusted by changing the potential of the control electrode, as described above.

Figure 4:
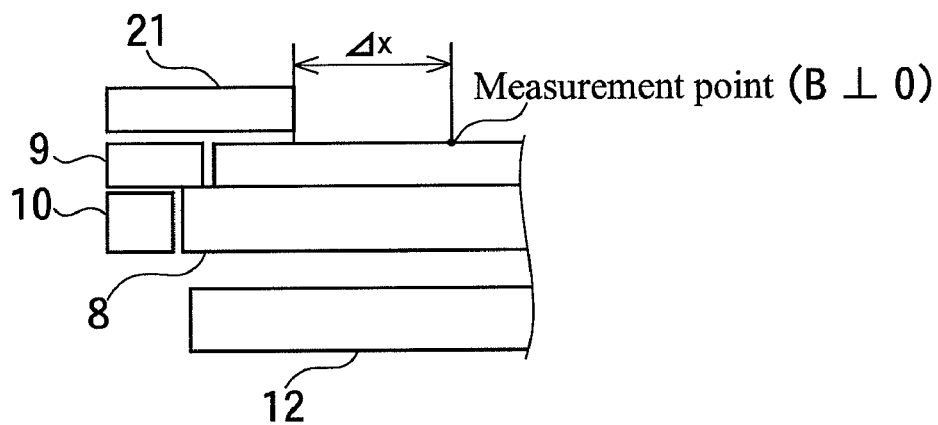
FIG. 4 is a diagram for illustrating a method of measuring a relationship between the projection length of a control electrode and the film thickness.
Figure 5:
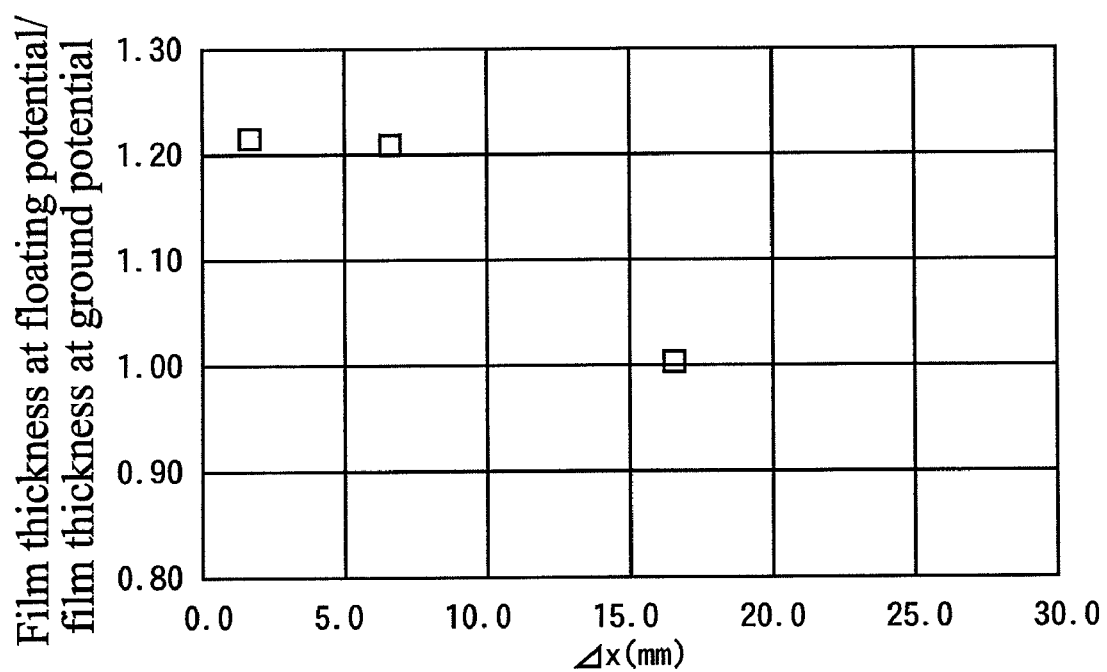
FIG. 5 is a graph for showing a relationship between the distance between the tip end part of the control electrode and the measurement point (B⊥0) and the film thickness.
Figure 6:
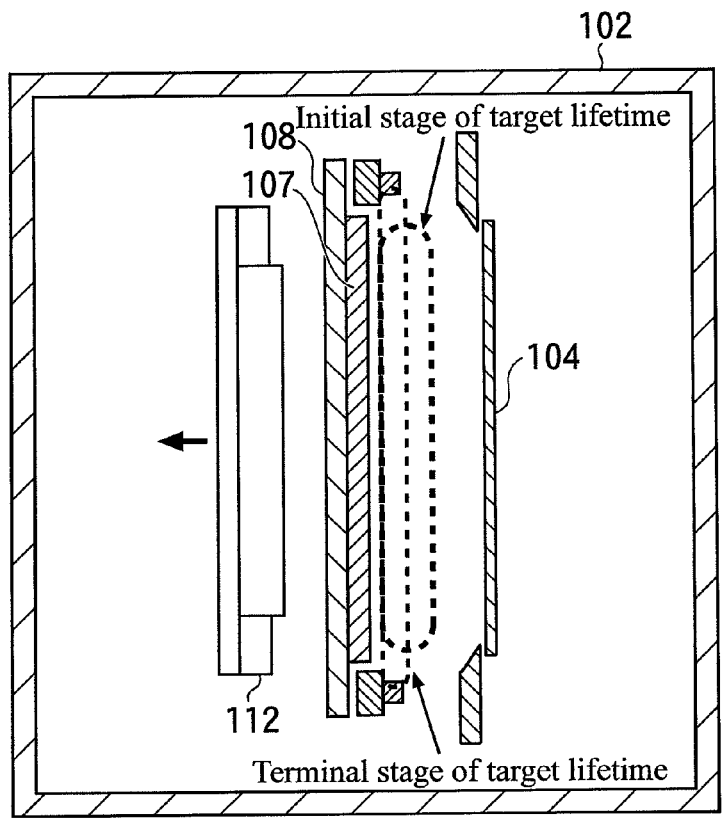
FIG. 6(a) is a sectional view for showing an internal structural arrangement of a conventional magnetron sputtering apparatus.
FIG. 6(b) is a diagram for illustrating a problem of the conventional art.
FIG. 6(c) is a diagram for illustrating a problem of the conventional art.
Figure 6:
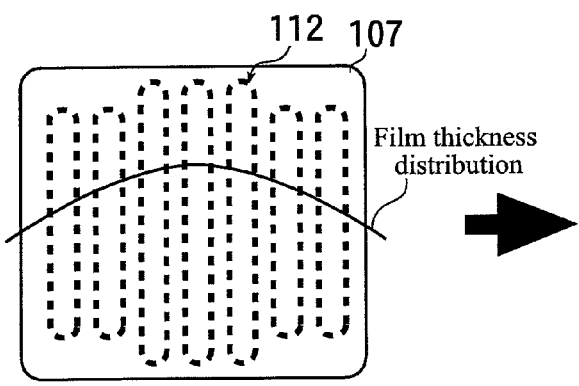
Figure 6:
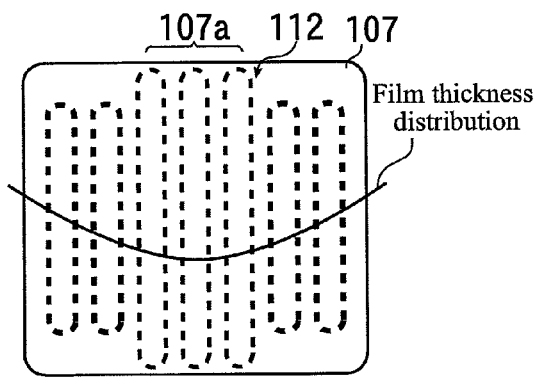

FIG. 4 is a diagram for illustrating a method of measuring a relationship between the projection length of the control electrode and the film thickness in the above-described example; and FIG. 5 is a graph representing a relationship between the distance (Δx) between the tip end part of the control electrode and the measurement point (B⊥0) and the film thickness. The measurement point (B⊥0) is a point where the orthogonal component of a magnetic field vector, which is formed by the magnet, with respect to the target is zero on the target surface.

As will be understood from FIG. 4 and FIG. 5, as the distance Δx between the tip end parts of the control electrodes 21, 22 and the measurement point decreases (that is, as the projection length toward the inside of the target 7 of the control electrodes 21, 22 increases), there is a tendency for the ratio of the film thickness at the floating potential with respect to the film thickness at the ground potential to increase.

This means that the film formation rate is increased due to the projection length of the control electrodes 21, 22 being made longer, as seen from the results shown in FIG. 3 and as described above.

What is claimed is:

1. A magnetron sputtering apparatus comprising:
a vacuum chamber;
a cathode part provided in the vacuum chamber, the cathode part holding a target on a front side of the cathode part and having a holding mechanism that holds a plurality of rod-shaped magnets on the back side thereof,
a power source that supplies power to the cathode part; and
a plurality of a pair of control electrodes that independently controls potentials provided in a discharge space on a side of the target,
wherein the pairs of control electrodes are respectively provided corresponding to each of the plurality of magnets and arranged so as to overlap respective end parts of the magnets, and each of the control electrode of the pairs of control electrodes is arranged so as to project inward with respect to an end edge part of the target.

2. A magnetron sputtering method for generating a magnetron discharge in a vacuum to perform sputtering, comprising the steps of:
arranging a plurality of rod-shaped magnets on a back side of a target;
arranging a plurality of a pair of control electrodes on a front side of the target, the pairs of control electrodes being respectively provided corresponding to each of the plurality of magnets and arranged so as to overlap respective end parts of the magnets, and each of the control electrode of the pairs of control electrodes being arranged so as to project inward with respect to an end edge part of the target,
making potentials of the pairs of control electrodes different from one another when supplying power to the target in a vacuum and generating plasma.

3. The magnetron sputtering method according to claim 2, wherein the potential of the control electrode in a specific region of the target among the plurality of control electrodes is made higher than the potential of the control electrodes in regions other than the specific region of the target when supplying power to the target in a vacuum and generating plasma.

4. The magnetron sputtering method according to claim 3, wherein the specific region of the target is the center region of the target.

5. The magnetron sputtering method according to any one of claims 3 and 4, wherein the potential of the control electrode in the specific region of the target is set at a floating potential and on the other hand, the potentials of the control electrodes in regions other than the specific region of the target are set at a ground potential.

* * * * *